(12) United States Patent
Nakamura

(10) Patent No.: US 7,713,364 B2
(45) Date of Patent: May 11, 2010

(54) MANGANESE ALLOY SPUTTERING TARGET AND METHOD FOR PRODUCING THE SAME

(75) Inventor: Yuichiro Nakamura, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 545 days.

(21) Appl. No.: 11/687,765

(22) Filed: Mar. 19, 2007

(65) Prior Publication Data

US 2007/0163878 A1     Jul. 19, 2007

Related U.S. Application Data

(62) Division of application No. 10/474,451, filed as application No. PCT/JP02/01341 on Feb. 18, 2002, now Pat. No. 7,229,510.

(30) Foreign Application Priority Data

Apr. 16, 2001  (JP)  ............................ 2001-116323
Jun. 1, 2001   (JP)  ............................ 2001-167040

(51) Int. Cl.
*C22F 1/16*  (2006.01)
*C22F 1/14*  (2006.01)
*C22F 1/10*  (2006.01)

(52) U.S. Cl. ........................ 148/707; 148/501; 148/676; 148/678

(58) Field of Classification Search ...................... None
See application file for complete search history.

(56) References Cited

U.S. PATENT DOCUMENTS 4,415,529 A * 11/1983 Masumoto et al. .......... 420/434

6,165,607 A     12/2000  Yamanobe et al.
6,458,182 B2    10/2002  Shindo et al.
6,736,947 B1    5/2004   Watanabe et al.
7,229,510 B2 *  6/2007   Nakamura ................... 148/430
2001/0015246 A1 8/2001   Yao et al.
2003/0052000 A1 3/2003   Segal et al.

FOREIGN PATENT DOCUMENTS

| EP | 1091015 A1 | 4/2001 |
|----|------------|--------|
| JP | 61-124566 A | 6/1986 |
| JP | 63-238268 A | 10/1988 |
| JP | 03-170386 A | 7/1991 |
| JP | 04-009467 A | 1/1992 |
| JP | 11-264070 A | 9/1999 |
| JP | 2000-160330 A | 6/2000 |
| JP | 2000-239836 A | 9/2000 |

OTHER PUBLICATIONS

ESP@CENET Database, English language Abstract of JP 2001-026861, Jan. 30, 2001.

* cited by examiner

*Primary Examiner*—John P Sheehan
(74) *Attorney, Agent, or Firm*—Howson & Howson LLP

(57) ABSTRACT

A manganese alloy sputtering target characterized in that oxygen is 1000 ppm or less, sulfur is 200 ppm or less and a forged texture is provided, and a method for producing a forged manganese alloy target stably by eliminating the drawbacks of manganese alloy that it is susceptible to cracking and has a low rupture strength. A manganese alloy sputtering target which can form a thin film exhibiting high characteristics and high corrosion resistance while suppressing generation of nodules or particles is thereby obtained.

16 Claims, 1 Drawing Sheet

A

100 μm

B

25 μm

A

100 μm

B

25 μm

MANGANESE ALLOY SPUTTERING TARGET AND METHOD FOR PRODUCING THE SAME

CROSS REFERENCE TO RELATED APPLICATIONS

This application is a divisional of U.S. application Ser. No. 10/474,451, which is the National Stage of International Application No. PCT/JP02/01341, filed Feb. 18, 2002, which claims the benefit under 35 USC 119 of Japanese Application No. 2001-116323, filed Apr. 16, 2001, and Japanese Application No. 2001-167040, filed Jun. 1, 2001.

BACKGROUND OF THE INVENTION

The present invention relates to a low-oxygen, low-sulfur, large-diameter (shape) manganese alloy sputtering target and the manufacturing method thereof, and in particular, to a manganese alloy sputtering target capable of forming a thin film exhibiting high characteristics and high corrosion resistance while suppressing the generation of nodules and particles.

A magnetic recording device such as a computer hard drive has been miniaturized by leaps and bounds in recent years, and the recording density is on the verge of achieving several 10 $Gb/in^2$. Thus, as the reproducing head, a conventional conductive head has reached its limit, and an anisotropic magnetoresistive (AMR) head is now being used.

And, this anisotropic magnetoresistive (AMR) head grew rapidly on a global scale pursuant to the expansion of the personal computer market and so on, and now a high-density giant magnetoresistive (GMR) head is being put into practical use.

In light of the above, manganese alloy of manganese and elements of the platinum group or the like have been used recently as an antiferromagnetic film of a spin valve film used in the GMR head, and expeditious research and development is being conducted for the further improvement of efficiency. Moreover, this antiferromagnetic film is not only used in GMR, but is used in TMR as well, and may also be used in MRAM and the like.

Upon manufacturing the likes of a giant magnetoresistive (GMR) head, for example, the respective layers structuring the head is deposited with the sputtering method.

In general, a target used in sputtering is manufactured with a hot pressing method of sintering powder, a powder metallurgy method such as the HIP method, or a melting method. When manufacturing a manganese alloy target composed from manganese and elements of the platinum group or the like from the foregoing powder metallurgy method, there is an advantage in that the shape yield is favorable and the rupture strength is high.

Nevertheless, in the case of this powder metallurgy method, there are problems in that the specific surface area of the raw material power is large, the amount of oxygen adsorbed is considerably large and, since the amount of oxygen and other impurity elements getting mixed into the manufacturing process of the target increases, the density is low. The existence of oxygen as described above will deteriorate the magnetic property of the film, and this is clearly undesirable.

Formation of the film with the sputtering method is conducted by physically colliding a positive ion such as Ar ion to the target established in the cathode, discharging the materials structuring the target with such collision energy, and laminating films having a composition approximately the same as the target material on the opposing anode side substrate.

Coating with the sputtering method is characterized in that a thin film of an Angstrom level to a thick film of several ten μm can be formed with a stable deposition speed by adjusting the processing time and power supply or the like.

Nevertheless, a particular problem in the case of forming the foregoing film is the density of the sputtering target and the generation of nodules during the sputtering operation.

A manganese alloy target is manufactured by sintering mixed powder in which manganese powder and power of elements of the platinum group or the like are mixed at a prescribed ratio, but since the powders originally have different elemental compositions, variations arise in the particle size of the powder, and there is a problem in that a dense sintered body is difficult to obtain.

In addition, since the film layers are becoming even more miniaturized and dense, the films themselves are also being thinly miniaturized, and, if the formed films are not even, the quality tends to deteriorate. Therefore, it is important to reduce the pores while unifying the elements of the target.

Moreover, when nodules increase on the erosion face of the target, this will induce irregular sputtering, and, in some cases, there may be a problem of a short circuit occurring as a result of abnormal electrical discharge or the formation of a cluster (clumped) film. Simultaneously, enlarged particles begin to float within the sputtering chamber, and a problem arises in that these particles similarly re-adhere on the substrate and cause protrusions on the thin film.

In light of the above, although it was necessary to obtain a high-density sintered target where the elements are even, there is a problem with those obtained with the powder metallurgy method in that the deterioration in density was inevitable, and the generation of nodules and particles could not be avoided.

Meanwhile, with the melting method, adsorption of oxygen and the like arising in powder metallurgy would not occur, and there is a feature in that the density of the target is higher in comparison to a sintered body. Nevertheless, although the Mn alloy target obtained with the melting method has superior characteristics, there is a problem in that it is susceptible to cracking and has low rupture strength in comparison to a sintered body.

Therefore, a proposal has been made for increasing the rupture strength by using a soluble casting while maintaining the brittleness or making the cast structure a Dendritic structure (Japanese Patent Laid-Open Publication No. 2001-26861). Nevertheless, a cast structure possesses anisotropy, and, even if the rupture strength could be improved by making it a Dendritic structure, it is highly likely that such anisotropy would be reflected in the sputtering deposition and defects would thereby arise in the evenness thereof.

Furthermore, although the sintering method is preferable from the perspective of manufacturing costs and raw material yield, a proposal has also been made for employing a material obtained with the melting method upon performing plastic forming thereto (Japanese Patent Laid-Open Publication No. 2000-160332). Nevertheless, in this case, it is uncertain as to what kind of plastic forming is employed, or the degree of performing such plastic forming, and there are proposals that are merely armchair theories.

As a matter of fact, the foregoing manganese alloy target that is susceptible to cracking and has a low rupture strength is not able to overcome the problems described above unless a specific proposal is provided for resolving the brittleness.

SUMMARY OF THE INVENTION

An object of the present invention is to overcome the various problems described above; that is, to eliminate the drawbacks of manganese alloy that it is susceptible to cracking and has a low rupture strength, provide a stable manufacturing method of a forged manganese alloy target, and providing a manganese alloy sputtering target which can form a thin film exhibiting high characteristics and high corrosion resistance while suppressing generation of nodules or particles.

It has been discovered that, by improving the processing method as the technical means for resolving the foregoing problems, it is possible to manufacture a forged manganese alloy sputtering target. Based on the foregoing discovery, the present invention provides a manganese alloy sputtering target characterized in that oxygen is 1000 ppm or less, sulfur is 200 ppm or less and a forged texture is provided. The number of oxide particles having a grain diameter of 5 μm or greater is one or less per unit area (100 μm×100 μm). The manganese alloy sputtering target has a single phase equiaxed grain structure, a crystal grain diameter of 500 μm or less, and is composed of at least one type selected among Ni, Pd, Pt, Rh, Ir, Au, Ru, as, Cr and Re, and remnant Mn 10 to 98 at %.

A manufacturing method of a manganese alloy sputtering target according to the present invention is characterized in that a manganese alloy ingot obtained by melting with the likes of an inductive melting method, arc melting method or electron beam melting method is forged at an average actual strain rate of $1 \times 10^{-2}$ to $2 \times 10^{-5}$ (1/s). Forging is performed at $0.75\, Tm(K) \leq T(K) \leq 0.98\, Tm(K)$ (provided that T(K): forging temperature and Tm(K): melting point of manganese alloy). More preferably, forging is performed at $0.80\, Tm(K) \leq T(K) \leq 0.90\, Tm(K)$ (provided that T(K): forging temperature and Tm(K): melting point of manganese alloy). Forging is performed at $30\% \leq draft \leq 99\%$, upset forging or die forging is performed, and forging is performed in a vacuum or tinder an inert gas atmosphere. The method produces a manganese alloy sputtering target characterized in that oxygen is 1000 ppm or less, sulfur is 200 ppm or less and a forged texture is provided. The number of oxide particles having a grain diameter of 5 μm or greater is one or less per unit area (100 μm×100 μm). The manganese alloy sputtering target has a single phase equiaxed grain structure, a crystal grain diameter of 500 μm or less, and is composed of at least one type selected among Ni, Pd, Pt, Rh, Ir, Au, Ru, as, Cr and Re, and remnant Mn 10 to 98 at %.

DETAILED DESCRIPTION OF THE INVENTION

Figure 1:
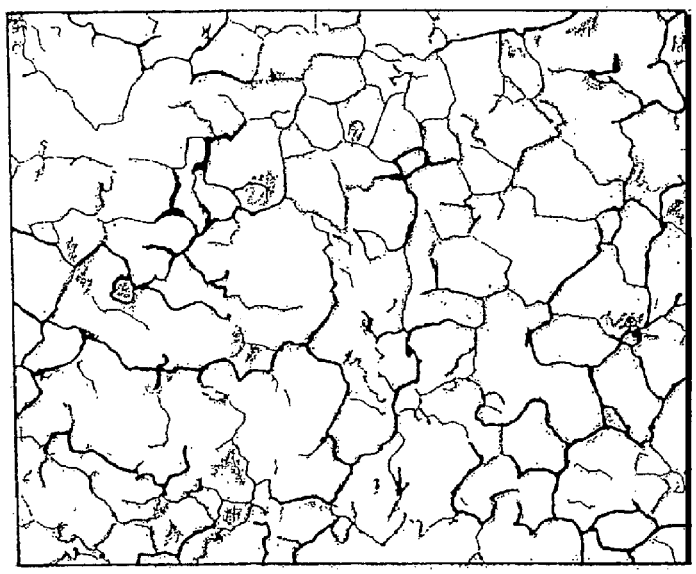
FIG. 1 is an imitative diagram of a microscopic texture photograph of the manganese platinum alloy according to Example 2.
Figure 1:
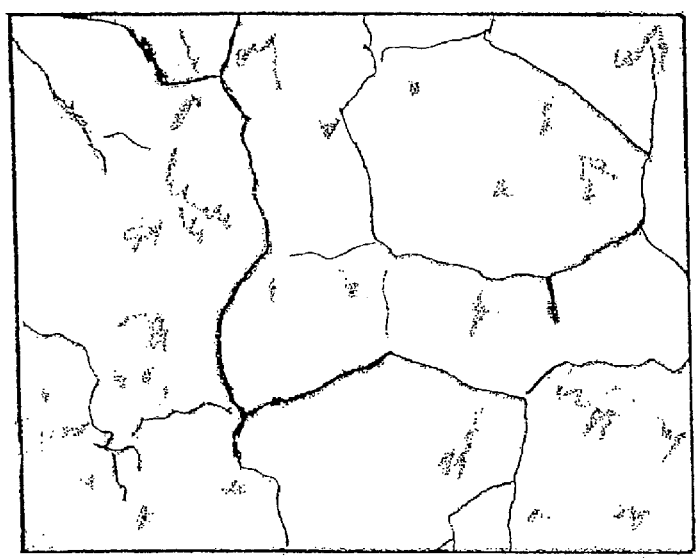

The manganese alloy sputtering target of the present invention is applicable to manganese alloy composed primarily of at least one type selected among Ni, Pd, Pt, Rh, Ir, Au, Ru, Os, Cr and Re, and remnant Mn 10 to 98 at %.

These manganese alloys are useful as an antiferromagnetic film of a spin valve film that may be used in a giant magnetoresistive head; that is, a GMR head or a TMR head, and, eventually, in an MRAM and the like.

High purity raw materials composed of such manganese alloys are melted with the electron beam melting method, arc melting method or inductive dissolution method. In order to avoid the contamination of oxygen, it is desirable that melting is performed in a vacuum or under an inert atmosphere. Thereby, volatile substances will be eliminated, and the purity will increase even more. This is cast to obtain a high-purity manganese alloy ingot.

Preferably, the ingot is upset forged or die forged in a vacuum or under an inert gas atmosphere. Forging is performed at an average actual strain rate of $1 \times 10^{-2}$ to $2 \times 10^{-5}$ (1/s). If the average actual strain rate exceeds $1 \times 10^{-2}$ (1/s), cracks occur easily, and, if less than $2 \times 10^{-5}$ (1/s), much time would be required for forging and this would be inefficient.

It is desirable that forging is performed at a forging temperature T(K) where $0.75\, Tm(K) \leq T(K) \leq 0.98\, Tm(K)$. In the formula, Tm(K) is the melting point of manganese alloy. If less than 0.75 Tm(K), cracks occur easily, and when exceeding 0.98 Tm(K), processing would not be easy considering the high temperature, and this would be inefficient. A particularly preferable forging temperature range would be $0.80\, Tm(K) \leq T(K) \leq 0.90\, Tm(K)$. It is desirable that the draft is 30% or more, and 99% or less.

As a result of the forging described above, it will be possible to manufacture a manganese alloy sputtering target in which oxygen is 1000 ppm or less and sulfur is 200 ppm or less.

Moreover, it will also be possible to manufacture a manganese alloy sputtering target in which the number of oxide particles having a particle diameter of 5 μm or greater is one or less per unit area (100 μm×100 μm), the target have a single phase equiaxed grain structure, and the crystal grain diameter is 500 μm or less.

EXAMPLES AND COMPARATIVE EXAMPLES

Next, the Examples and Comparative Examples of the present invention are explained. The Examples are mere exemplifications of the present invention, and shall not limit the present invention in any way. In other words, modifications and other modes based on the technical spirit of the present invention shall all be included herein.

Example 1 to Example 5

Ingots were prepared by melting the raw material composed of the manganese-platinum having the composition shown in Table 1 under an argon atmosphere using a vacuum induction melting furnace.

And, a manganese platinum alloy sputtering target was obtained by upset forging these ingots under an inert gas atmosphere. Forging conditions such as the melting point, forging temperature, draft, actual strain rate and so on of the respective manganese platinum alloys are similarly shown in Table 1.

Moreover, the oxygen content, sulfur content, number of oxide particles having a grain diameter of 5 μm or greater per unit area (100 μm×100 μm) and average grain diameter (μm) of the manganese platinum alloys obtained by the forging described above are shown in Table 2.

With respect to Example 2, microscopic texture photographs of the manganese platinum alloy are shown in FIG. 1(A, B).

TABLE 1

| | Mn (at %) | Pt (at %) | Melting Point (° C.) | Forging Temperature (° C.) | Draft (%) | Actual Strain Rate (1/s) |
|---|---|---|---|---|---|---|
| Example 1 | 79.9 | 20.1 | 1190 | 1050 | 42.1 | $1.9 \times 10^{-4}$ |
| Example 2 | 59.9 | 40.1 | 1380 | 1200 | 75.1 | $4.6 \times 10^{-4}$ |
| Example 3 | 55.0 | 45.0 | 1460 | 1200 | 65.3 | $3.8 \times 10^{-4}$ |
| Example 4 | 50.0 | 50.0 | 1480 | 1250 | 75.3 | $1.1 \times 10^{-4}$ |
| Example 5 | 39.8 | 60.2 | 1420 | 1250 | 62.7 | $1.4 \times 10^{-4}$ |
| Comparative Example 1 | 59.5 | 40.5 | — | — | — | — |
| Comparative Example 2 | 59.7 | 40.3 | — | — | — | — |
| Comparative Example 3 | 59.9 | 40.1 | — | — | — | — |

TABLE 2

| | Oxygen Content (wtppm) | Sulfur Content (wtppm) | Number of Oxide Particles | Average Grain Diameter (μm) |
|---|---|---|---|---|
| Example 1 | 40 | 20 | 0.0 | 120 |
| Example 2 | 150 | 40 | 0.0 | 50 |
| Example 3 | 310 | 50 | 0.1 | 100 |
| Example 4 | 110 | 30 | 0.0 | 110 |
| Example 5 | 180 | 10 | 0.0 | 140 |
| Comparative Example 1 | 1910 | 100 | 11.0 | <10 |
| Comparative Example 2 | 800 | 70 | 7.0 | <10 |
| Comparative Example 3 | 320 | 70 | 0.0 | 700 |

Number of Oxide Particles: Particles per unit area (100 μm × 100 μm) of oxide particles having a grain diameter of 5 μm or more Comparative Example 1 to Comparative Example 3

Comparative Example 1 shows a case where the manganese powder and platinum powder shown in Table 1 were mixed, and thereafter hot pressed at a temperature of 1200° C. and a pressure of 150 kg/cm² in order to obtain a sputtering target; Comparative Example 2 shows a case where the manganese and platinum powders were synthesized, and thereafter hot pressed at a temperature of 1200° C. and a pressure of 150 kg/cm² in order to obtain a sputtering target; and Comparative Example 3 shows a case where, as with the Examples, the raw material composed of manganese-platinum was melted under an argon atmosphere using a vacuum induction melting furnace in order to prepare a manganese platinum ingot. And a manganese platinum target was obtained by cutting this ingot.

The composition, oxygen content, sulfur content, number of oxide particles having a particle diameter of 5 μm or greater per unit area (100 μm×100 μm) and average grain diameter (μm) of the obtained targets are shown in Table 1 and Table 2 as comparisons with the Examples.

Example 6

Ingots were prepared by melting the raw material composed of the manganese-iridium having the composition shown in Table 3 under an argon atmosphere using a vacuum induction melting furnace.

And, a manganese iridium alloy sputtering target was obtained by upset forging these ingots under an inert gas atmosphere. Forging conditions such as the melting point, forging temperature, draft, actual strain rate and so on of the respective manganese iridium alloys are similarly shown in Table 3.

Moreover, the oxygen content, sulfur content, number of oxide particles having a grain diameter of 5 μm or greater per unit area (100 μm×100 μm) and average grain diameter (μm) of the manganese alloys obtained by the forging described above are shown in Table 4.

TABLE 3

| | Mn (at %) | Ir (at %) | Melting Point (° C.) | Forging Temperature (° C.) | Draft (%) | Actual Strain Rate (1/s) |
|---|---|---|---|---|---|---|
| Example 6 | 78.9 | 21.9 | 1520 | 1200 | 64.4 | $3.4 \times 10^{-4}$ |
| Comparative Example 4 | 78.4 | 21.6 | — | — | — | — |
| Comparative Example 5 | 77.9 | 22.1 | — | — | — | — |

TABLE 4

| | Oxygen Content (wtppm) | Sulfur Content (wtppm) | Number of Oxide Particles | Average Grain Diameter (μm) |
|---|---|---|---|---|
| Example 6 | 70 | 50 | 0.0 | 150 |
| Comparative Example 4 | 2870 | 160 | 15.0 | <10 |
| Comparative Example 5 | 220 | 60 | 0.1 | 600 |

Number of Oxide Particles: Particles per unit area (100 μm × 100 μm) of oxide particles having a grain diameter of 5 μm or more Comparative Example 4 to Comparative Example 5

Comparative Example 4 shows a case where the manganese powder and iridium powder shown in Table 3 were mixed, and thereafter hot pressed at a temperature of 1050° C. and a pressure of 150 kg/cm² in order to obtain a sputtering target; and Comparative Example 5 shows a case where, as with the Examples, the raw material composed of manganese—iridium was melted under an argon atmosphere using a vacuum induction melting furnace in order to prepare a manganese iridium alloy ingot.

And a manganese iridium alloy target was obtained by cutting this ingot. The composition, oxygen content, sulfur content, number of oxide particles having a grain diameter of 5 μm or greater per unit area (100 μm×100 μm) and average grain diameter (μm) of the obtained targets are shown in Table 3 and Table 4 as comparisons with the Examples.

Example 7

Ingots were prepared by melting the raw material composed of the manganese-nickel having the composition shown in Table 5 under an argon atmosphere using a vacuum induction melting furnace.

And, a manganese nickel alloy sputtering target was obtained by upset forging these ingots under an inert gas atmosphere. Forging conditions such as the melting point, forging temperature, draft, actual strain rate and so on of the respective manganese nickel alloys are similarly shown in Table 3.

Moreover, the oxygen content, sulfur content, number of oxide particles having a grain diameter of 5 μm or greater per unit area (100 μm×100 μm) and average grain diameter (μm)

of the manganese nickel alloy obtained by the forging described above are shown in Table 6.

TABLE 5

|  | Mn (at %) | Ni (at %) | Melting Point (° C.) | Forging Temperature (° C.) | Draft (%) | Actual Strain Rate (1/s) |
|---|---|---|---|---|---|---|
| Example 7 | 49.9 | 50.1 | 1060 | 950 | 61.2 | $5.3 \times 10^{-4}$ |
| Comparative Example 6 | 49.8 | 50.2 | — | — | — | — |

TABLE 6

|  | Oxygen Content (wtppm) | Sulfur Content (wtppm) | Number of Oxide Particles | Average Grain Diameter (μm) |
|---|---|---|---|---|
| Example 7 | 20 | 80 | 0.0 | 60 |
| Comparative Example 6 | 30 | 150 | 0.0 | 1000 |

Number of Oxide Particles: Particles per unit area (100 μm × 100 μm) of oxide particles having a grain diameter of 5 μm or more.

Comparative Example 6

As shown in Table 5, Comparative Example 6 shows a case where, as with the Example 7, the raw material composed of manganese—nickel was melted under an argon atmosphere using a vacuum induction melting furnace in order to prepare an ingot. And a manganese nickel target was obtained by cutting this ingot.

The composition, oxygen content, sulfur content, number of oxide particles having a grain diameter of 5 μm or greater per unit area (100 μm×100 μm) and average grain diameter (μm) of the obtained targets are shown in Table 5 and Table 6 as comparisons with Example 7.

Next, sputtering was performed with the sputtering targets (φ76.2 mm) obtained in the foregoing Examples and Comparative Examples in order to measure the generation (number) of nodules. Moreover, the number of nodules generated in this case represents a number that could be identified visually. The sputtering conditions were as follows.

Sputtering Gas: Ar

Sputtering Gas Pressure: 0.5 Pa

Sputtering Gas Flow Rate: 100 SCCM

Charge Power: 1 W/cm²

Sputtering Time: up to 40 hours

The measurement results of the generation (number) of nodules are shown in Table 7.

As evident from Table 7, the number of nodules that generated on the target surface of the Examples of the present invention was at the very most 22 in 20 hours, and only 31 even after 40 hours.

Contrarily, with the targets of the Comparative Examples, the number of nodules was 35 to 191 in 20 hours, and rapidly increased to 144 to 587 after 40 hours. In particular, the number of nodules was unusually abundant with a sintered target. As evident from these comparisons, it can be confirmed that the present invention yields significant effects.

TABLE 7

|  | Number of Nodules (after 20 hours) | Number of Nodules (after 40 hours) |
|---|---|---|
| Example 1 | 7 | 16 |
| Example 2 | 9 | 17 |
| Example 3 | 22 | 28 |
| Example 4 | 8 | 13 |
| Example 5 | 11 | 14 |
| Comparative Example 1 | 167 | 412 |
| Comparative Example 2 | 98 | 359 |
| Comparative Example 3 | 54 | 173 |
| Example 6 | 3 | 7 |
| Comparative Example 4 | 191 | 587 |
| Comparative Example 5 | 35 | 144 |
| Example 7 | 14 | 31 |
| Comparative Example 6 | 43 | 165 |

Number of Nodules: (Nodule/φ 76.2 mm)

As shown in Table 1 to Table 6, in each of the manganese alloys, although the average grain diameter is small in the Comparative Examples, the oxygen content and sulfur content, which are impurities, increased significantly with the sintered target of the Comparative Examples in comparison to the present invention. Moreover, the results showed that the number of oxide particles having a particle diameter of 5 μm or greater per unit area (100 μm×100 μm) also increased.

Among the Comparative Examples, those which were melted but not forged, and thereafter directly cut into targets were fairly close to the Examples of the present invention regarding the oxygen content and sulfur content, which are impurities, and the number of nodules. Nevertheless, the average grain diameter was unusually large, and, as described above, there is a problem in that it is susceptible to cracking and has low rupture strength, and is not sustainable for use.

With the targets obtained in the present Examples, as shown in FIGS. 1A and 1B, a forged texture that is dense and which has a small crystal grain size (500 μm or less) can be obtained. FIG. 1 shows the target that the average crystal grain is nearly 100 μm. As described above, the target of the present invention yields a significant feature in that it has high rupture strength and does not crack.

The present invention yields a superior effect of eliminating the drawbacks of manganese alloy that it is susceptible to cracking and has a low rupture strength, stably manufacturing a manganese alloy target with forging, and thereby obtaining a manganese alloy sputtering target which can form a thin film exhibiting high characteristics and high corrosion resistance while suppressing generation of nodules or particles.

The invention claimed is:

1. A method of manufacturing a manganese alloy sputtering target comprising the steps of:
    obtaining a manganese alloy ingot by a melting method selected from the group consisting of an inductive melting method, an arc melting method, and an electron beam melting method, and
    forging said manganese alloy ingot at an average actual strain rate of $1 \times 10^{-2}$ to $2 \times 10^{-5}$ (1/s) to form a forged manganese alloy sputtering target consisting of at least one of Ni, Pd, Pt, Rh, Ir, Au, Ru, Os, Cr and Re, and remnant Mn 39.8 to 98 at %,
    said forging step being performed at 0.75 Tm(K)≦T(K) ≦0.98 Tm(K), wherein T(K) is the forging temperature and Tm(K) is the melting point of said manganese alloy.
2. A method according to claim 1, wherein forging is performed at 0.80 Tm(K)≦T(K)≦0.90 Tm(K).
3. A method according to claim 2, wherein forging is performed at 30%≦draft≦99%.

4. A method according to claim 3, wherein said forging is performed as upset forging or die forging.

5. A method according to claim 4, wherein forging is performed in a vacuum or under an inert gas atmosphere.

6. A method according to claim 5, wherein said forging step includes forming the manganese alloy sputtering target such that the target contains 1000 ppm or less of oxygen and 200 ppm or less of sulfur.

7. A method according to claim 6, wherein said forging step includes forming the manganese alloy sputtering target with one or less oxide particles per unit area (100 μm×100 μm) that has a particle diameter of 5 μm or greater.

8. A method according to claim 7, wherein said forging step includes forming the manganese alloy sputtering target with a single phase equiaxed grain structure.

9. A method according to claim 8, wherein said forging step includes forming the manganese alloy sputtering target with a crystal grain diameter of 500 μm or less.

10. A method according to claim 1 wherein forging is performed at 30%≦draft≦99%.

11. A method according to claim 1, wherein said forging is performed as upset forging or die forging.

12. A method according to claim 1, wherein forging is performed in a vacuum or under an inert gas atmosphere.

13. A method according to claim 1, wherein said forging step includes forming the manganese alloy sputtering target such that the target contains 1000 ppm or less of oxygen and 200 ppm or less of sulfur.

14. A method according to claim 1, wherein said forging step includes forming the manganese alloy sputtering target with one or less oxide particles per unit area (100 μm×100 μm) that has a particle diameter of 5 μm or greater.

15. A method according to claim 1, wherein said forging step includes forming the manganese alloy sputtering target with a single phase equiaxed grain structure.

16. A method according to claim 1, wherein said forging step includes forming the manganese alloy sputtering target with a crystal grain diameter of 500 μm or less.

* * * * *

UNITED STATES PATENT AND TRADEMARK OFFICE
CERTIFICATE OF CORRECTION

| | |
|---|---|
| PATENT NO. | : 7,713,364 B2 |
| APPLICATION NO. | : 11/687765 |
| DATED | : May 11, 2010 |
| INVENTOR(S) | : Yuichiro Nakamura |

It is certified that error appears in the above-identified patent and that said Letters Patent is hereby corrected as shown below:

In the Specification

Column 3, line 31, "actual" should read "true"

Column 4, line 11, "actual" should read "true"

Column 4, line 12, "actual" should read "true"

Column 4, line 56, "actual" should read "true"

Column 5, line 4, "Actual" should read "True"

Column 6, line 1, "actual" should read "true"

Column 6, line 12, "Actual" should read "True"

Column 6, line 62, "actual" should read "true"

Column 7, line 6, "Actual" should read "True"

In the Claims

Column 8, line 56, "actual" should read "true"

Signed and Sealed this
Twenty-third Day of June, 2015

Michelle K. Lee
*Director of the United States Patent and Trademark Office*